United States Patent
Benjamin et al.

[11] Patent Number: 5,948,704
[45] Date of Patent: *Sep. 7, 1999

[54] HIGH FLOW VACUUM CHAMBER INCLUDING EQUIPMENT MODULES SUCH AS A PLASMA GENERATING SOURCE, VACUUM PUMPING ARRANGEMENT AND/ OR CANTILEVERED SUBSTRATE SUPPORT

[75] Inventors: Neil Benjamin, East Palo Alto; Jon Hylbert, Los Gatos; Stefano Mangano, Menlo Park, all of Calif.

[73] Assignee: LAM Research Corporation, Fremont, Calif.

[*] Notice: This patent is subject to a terminal disclaimer.

[21] Appl. No.: 08/658,262

[22] Filed: Jun. 5, 1996

[51] Int. Cl.⁶ .................. H01L 21/306; H01L 21/3065; H05H 1/00

[52] U.S. Cl. .................. 438/715; 118/723 R; 118/725; 118/728; 118/733; 156/345; 216/67; 216/68; 216/69; 279/128; 427/569; 427/570; 427/571; 427/573; 427/575

[58] Field of Search .................. 361/239; 269/35, 269/47, 52; 279/128; 216/24, 58, 67, 68, 69, 70, 71, 80; 427/569, 570, 571, 573, 574, 575, 585, 166, 167; 156/345; 118/722, 723 R, 725, 728, 733; 204/298.07, 298.09, 298.15, 298.33, 298.35; 438/715

[56] References Cited

U.S. PATENT DOCUMENTS

| | | | |
|---|---|---|---|
| 4,340,462 | 7/1982 | Koch | 204/298.35 |
| 4,534,816 | 8/1985 | Chen et al. | 156/345 |
| 4,579,618 | 4/1986 | Celestino et al. | 156/345 |
| 4,615,755 | 10/1986 | Tracy et al. | 156/345 |
| 4,665,463 | 5/1987 | Ward et al. | 361/234 |
| 4,692,836 | 9/1987 | Suzuki | 361/234 |
| 4,911,810 | 3/1990 | Lauro et al. | 204/192.12 |
| 4,948,458 | 8/1990 | Ogle | 156/345 |
| 5,013,400 | 5/1991 | Kurasaki et al. | 156/345 |
| 5,055,964 | 10/1991 | Logan et al. | 361/234 |
| 5,160,152 | 11/1992 | Toraguchi et al. | 361/234 |

(List continued on next page.)

FOREIGN PATENT DOCUMENTS

| | | |
|---|---|---|
| 0607797 A1 | 7/1994 | European Pat. Off. . |
| 2052848 | 1/1981 | United Kingdom . |
| WO97/03224 | 1/1997 | WIPO . |
| WO 88/02548 | 4/1998 | WIPO . |

*Primary Examiner*—Jeffrey E. Russel
*Attorney, Agent, or Firm*—Burns, Doane, Swecker & Mathis, L.L.P.

[57] ABSTRACT

A vacuum processing chamber having a substrate support removably mounted therein. The chamber includes an opening in a sidewall thereof and the opening is large enough to allow the substrate support to be removed from the chamber through the opening. A modular mounting arrangement extends through the opening and removably supports the substrate support in the interior of the chamber at a position located inwardly of an inner sidewall of the chamber. The mounting arrangement includes a mounting flange and a support arm. The mounting flange is attached to an exterior surface of the chamber and the support arm extends between the substrate support and the mounting flange. The chamber includes a single vacuum port in a central portion of an endwall of the chamber spaced from the substrate support. The vacuum port is connected to a vacuum pump which removes gases from the interior of the chamber and maintains the chamber at a pressure below atmospheric pressure. The substrate support is easy to service or replace since it can be removed through a sidewall of the chamber. The sidewall mounted substrate support also allows a large vacuum port to be located in the endwall of the chamber thus allowing high flow to be achieved by connecting the vacuum port a large capacity vacuum pump. The chamber also includes a modular liner, a modular plasma generating source and a modular vacuum pumping arrangement, each of which can be replaced with interchangeable equipment.

28 Claims, 8 Drawing Sheets

U.S. PATENT DOCUMENTS

| | | | |
|---|---|---|---|
| 5,200,232 | 4/1993 | Tappan et al. | 427/569 |
| 5,214,290 | 5/1993 | Sakai | 250/492.2 |
| 5,238,499 | 8/1993 | van de Ven et al. | 156/345 |
| 5,262,029 | 11/1993 | Erskine et al. | 204/298.15 |
| 5,304,248 | 4/1994 | Cheng et al. | 118/728 |
| 5,308,447 | 5/1994 | Lewis et al. | 156/626 |
| 5,326,725 | 7/1994 | Sherstinsky et al. | 437/225 |
| 5,328,516 | 7/1994 | Dietiker | 118/723 DC |
| 5,350,479 | 9/1994 | Collins et al. | 156/345 |
| 5,429,995 | 7/1995 | Nishiyama et al. | 437/238 |
| 5,605,637 | 2/1997 | Shan et al. | 156/345 |
| 5,708,556 | 1/1998 | van Os et al. | 361/234 |
| 5,716,486 | 2/1998 | Selwyn et al. | 156/345 |
| 5,792,272 | 8/1998 | van Os et al. | 118/723 IR |
| 5,820,723 | 10/1998 | Benjamin et al. | 156/345 |

HIGH FLOW VACUUM CHAMBER INCLUDING EQUIPMENT MODULES SUCH AS A PLASMA GENERATING SOURCE, VACUUM PUMPING ARRANGEMENT AND/ OR CANTILEVERED SUBSTRATE SUPPORT

FIELD OF THE INVENTION

The invention relates to equipment for processing substrates such as semiconductor wafers. The equipment includes a universal housing adapted for connection to equipment modules such as a plasma generating source, a vacuum pumping arrangement and/or a cantilevered substrate support.

DESCRIPTION OF THE RELATED ART

Vacuum processing chambers are generally used for etching and chemical vapor depositing (CVD) of materials on substrates by supplying an etching or deposition gas to the vacuum chamber and application of an RF field to the gas to energize the gas into a plasma state. Examples of parallel plate, transformer coupled plasma (TCP) which is also called inductively coupled plasma (ICP), and electron-cyclotron resonance (ECR) reactors are disclosed in commonly owned U.S. Pat. Nos. 4,340,462; 4,948,458; and 5,200,232. Vacuum processing chambers are typically designed to meet performance specifications which depend on the process to be carried out therein. Thus, the particular plasma generating source, vacuum pumping arrangement and substrate support associated with the particular processing chamber must be customized or specially designed to meet the performance specifications. The lack of modularity with respect to the ancillary equipment such as the plasma generating source, vacuum pumping arrangement and substrate support results in increased production costs, slower assembly time and lack of flexibility with respect to such ancillary equipment.

Substrates are typically held in place within the vacuum chamber during processing by substrate holders. Conventional substrate holders include mechanical clamps and electrostatic clamps (ESC). Examples of mechanical clamps and ESC substrate holders are provided in commonly owned U.S. Pat. No. 5,262,029 and commonly owned U.S. Pat. No. 5,671,116. Substrate holders in the form of an electrode can supply radiofrequency (RF) power into the chamber, as disclosed in U.S. Pat. No. 4,579,618. Mechanical clamps generally employ a clamp ring which surrounds the substrate and presses down on the top surface of the substrate around its periphery. Further examples of mechanical clamping rings are disclosed in U.S. Pat. Nos. 4,615,755; 5,013,400; and 5,326,725.

Substrates including flat panel displays and smaller substrates can be cooled by the substrate holder during certain processing steps. Such cooling is performed by the application of an inert gas, such as helium, between the substrate holder and the opposed surface of the substrate. For instance, see U.S. Pat. Nos. 5,160,152; 5,238,499; 5,350,479; and 5,534,816. The cooling gas is typically supplied to channels or a pattern of grooves in the substrate holder and applies a back pressure to the substrate which tends to cause the substrate to become bowed upward at the center when the substrate is held only along the edges by a mechanical clamping apparatus.

Electrostatic chucks are used for holding semiconducting and conducting substrates in place in a vacuum chamber in situations where it is desirable to avoid a clamping ring which extends over a portion of the substrate upper surface. Electrostatic chucks of the monopolar type utilize a single electrode. For instance, see U.S. Pat. No. 4,665,463. Electrostatic chucks of the bipolar type utilize mutual attraction between two electrically charged capacitor plates which are separated by a dielectric layer. For instance, see U.S. Pat. Nos. 4,692,836 and 5,055,964.

Substrate supports for vacuum processing chambers are typically mounted on a bottom wall of the chamber making servicing and replacement of the substrate support difficult and time consuming. Examples of such bottom mounted substrate supports can be found in U.S. Pat. Nos. 4,340,462; 4,534,816; 4,579,618; 4,615,755; 4,948,458; 5,200,232; and 5,262,029. It would be desirable, however, if the substrate support could be accessed and/or serviced through a sidewall of the process chamber. Moreover, a substrate arrangement providing improved flow of gases through the process chamber would also be highly advantageous for processing semiconductor substrates.

One drawback of conventional vacuum processing chambers is that such chambers may not provide high flow in a low pressure environment due to restrictions in the gas flow path and/or the inability to achieve low pressure. Thus, a vacuum processing chamber which achieves high conductance (i.e., low flow restriction) at low pressure would be highly desirable. For instance, a vacuum processing chamber which achieves high flow (e.g., at least 200 sccm) at low pressure (e.g., less than 10 mTorr) would be highly advantageous for processing semiconductor substrates.

SUMMARY OF THE INVENTION

The invention provides a vacuum processing chamber having improved serviceability, flexibility in choice of components and/or improvement in uniformity of gas flow especially at low pressures. The improved serviceability is provided by mounting arrangements which allow a plasma generating source, a substrate support and/or a vacuum pump to be easily removed from the chamber for servicing or replacement thereof. As the mounting arrangements are interchangeable, the chamber can be readily modified to incorporate a desired plasma generating source module in close proximity to the substrate support or further upstream, a desired substrate support module such as one having a mechanical chuck or an electrostatic chuck can be mounted in the chamber and/or a vacuum pump module having a desired pumping speed can be attached to the chamber. The chamber thus acts as a universal housing for manufacturing various types of vacuum chambers useful for processes such as plasma etching or CVD.

According to one aspect of the invention, a universal housing of a vacuum processing chamber is provided having first and second endwalls and a sidewall extending therebetween. The chamber can include a first opening in the first endwall, a second opening in the second endwall and/or a third opening in the sidewall. Each of the openings can be surrounded by a mounting arrangement which cooperates with a mating mounting arrangement attached to a vacuum pump module, plasma generating source module and/or substrate support module. For instance, the mounting arrangement surrounding the first opening can mate with a mounting arrangement attached to a plasma generating source module, the mounting arrangement surrounding the second opening can mate with a mounting arrangement attached to a vacuum pump module and the mounting arrangement surrounding the third opening can mate with a modular mounting arrangement attached to a substrate support module. Each of the openings can include a vacuum seal and an RF shielding member (e.g., RF gasket).

The first opening can be circular and include first and second recessed surfaces wherein the first recessed surface is inward of the second recessed surface. An O-ring seal can be located in a groove in each of the recessed surfaces for sealing the first opening. The mounting arrangement surrounding the third opening preferably mates with a mounting arrangement attached to a cantilevered substrate support assembly which includes a support arm and a substrate support. The support arm and substrate support can be sized to pass through the third opening (which can be non-circular, e.g., rectangular) for removal or assembly of the substrate support within the chamber. The mounting arrangement surrounding the second opening preferably mates with a mounting arrangement attached to a vacuum pump module. The sidewall of the chamber can comprise a cylindrical sidewall and the second opening can be circular wherein the flow area defined by the second opening is at least one-third of a maximum cross-sectional area defined by the cylindrical sidewall of the chamber.

According to another embodiment of the invention, a vacuum processing chamber is provided having a substrate support removably mounted therein in a cantilever fashion. The substrate support is mounted in an interior of the vacuum processing chamber by a mounting arrangement which extends through an opening in a sidewall of the chamber. The opening is large enough to allow the substrate support to be removed from the chamber through the opening. The mounting arrangement removably supports the substrate support in the interior of the chamber at a position located inwardly of an inner sidewall surface of the chamber.

According to various aspects of the invention, the processing chamber can be a high density plasma processing chamber wherein high density plasma is provided in a region adjacent the substrate support. The substrate support can include a chucking device which clamps a semiconductor substrate on a support surface of the substrate support. The chamber can include a vacuum port in a central portion of an endwall of the chamber and the endwall is separated from the substrate support by an open area. The vacuum port can be connected to a vacuum pump which removes gases from the interior of the chamber and maintains the chamber at a desired pressure such as below 100 mTorr.

The mounting arrangement can include a mounting flange and horizontally extending support arm having one end thereof attached to the substrate support and the other end thereof attached to the mounting flange. The mounting flange can include a portion fitted in the opening in the sidewall of the chamber. The opening can be tapered such that the opening decreases in size in a direction towards the interior of the chamber and the portion is tapered such that mating surfaces of the opening and the portion provide a tapered fit. The chamber can include an interior cylindrical surface surrounding the substrate support. The opening in the sidewall of the chamber can extend through the cylindrical surface and the portion of the mounting flange can include a curved surface facing the interior of the chamber with edges of the curved surface lying along edges of the opening in the cylindrical surface. The support arm is attached to the substrate support such that flow of gas past an outer periphery of the substrate support is substantially uniform. The mounting arrangement can include a vacuum seal surrounding the opening and maintaining a vacuum tight seal between the chamber and the mounting arrangement. The support arm can include service conduits in an interior thereof. These service conduits can supply cooling gas for backside cooling of a substrate on the substrate support, cooling liquid for temperature control of the substrate support, RF power for energizing an RF biasing electrode in the substrate support, pressurized gas for actuating a lift pin mechanism, electrical signal lines for monitoring equipment such as backside pressure, substrate support temperature, etc., supply of nitrogen or clean dry air to remove moisture from the interior of the support arm, and/or electrical power lines for actuating various components of the substrate support.

The invention also provides a method of processing a substrate in the process chamber described above. The method can include supplying a substrate to the process chamber at a position on the support surface of the substrate support, clamping the substrate to the support surface of the substrate support and processing the substrate. The process can include supplying a heat transfer gas between the substrate and the support surface of the substrate support. The exposed surface of the substrate can be etched or coated during the processing step. The process chamber can be part of an ECR reactor, TCP/ICP reactor, or parallel plate reactor, helicon reactor, helical resonator reactor, isotropic etching, microwave downstream reactor or photoresist stripping chamber. The substrate support can include a mechanical or electrostatic chuck for supporting a substrate such as a glass panel, semiconductor wafer or the like.

BRIEF DESCRIPTION OF THE DRAWINGS

The invention will be described in greater detail with reference to the accompanying drawings in which like elements bear like reference numerals, and wherein.

DETAILED DESCRIPTION OF THE PREFERRED EMBODIMENTS

The invention provides a vacuum processing chamber having improved serviceability, flexibility in design and manufacturing with respect to components (also referred to as modules) such as a plasma generating source, a substrate support and a vacuum pumping arrangement and/or improved uniformity of gas flow at extremely low pressures.

With respect to serviceability, conventional chamber designs do not allow easy access to various components of the chamber thus requiring a labor intensive and time consuming process for servicing or replacement of the chamber components. According to the invention, the plasma generating source, the substrate support and/or the vacuum pumping arrangement can be readily removed from the chamber for easy servicing thereof at a location away from the chamber or replacement of such components with interchangeable replacement components.

With respect to manufacturing flexibility, the present invention allows a manufacturer of vacuum processing equipment to produce a universal chamber for a wide range in type of process (e.g., etch, deposition, etc.), material to be processed (e.g., oxide, polysilicon, metal, nitride, etc.), or substrate size, typically within a given range (i.e., a particular universal chamber may be suited for a range of substrate sizes such as 150 to 300 mm). In this way the manufacturer may simply attach the appropriate energy source, substrate support, and vacuum apparatus, for a particular application, to the universal chamber. This is in contrast to a method of manufacturing wherein the entire system is manufactured specifically for the intended application, desired substrate size, desired substrate support, etc. Thus, lead times from order to delivery may be cut down considerably and changes in orders or cancellations can be more readily accommodated.

With respect to the design flexibility, a universal chamber housing can be fitted with hardware components which cooperate to carry out a particular process such as plasma etching or deposition. Also, such a universal chamber housing can be retrofitted with different components to carry out a different process, and/or process different substrate sizes and/or utilize a different substrate support. The universal chamber housing includes mounting arrangements (such as standardized interface ports), each of which accommodates a variety of interchangeable components. Such "modularity" greatly reduces the down time for servicing or retrofitting the chamber. Each kind of module (e.g., energy source, vacuum apparatus, substrate support, etc.) can be designed to be mounted to a standardized interface port on the chamber. Where it is desired to use a module that does not conform to the standardized interface port, it is possible to accommodate the module with adapter hardware to couple the module to the standardized interface port.

The invention also provides a high-flow chamber for processing semiconductor substrates such as semiconductor wafers, flat panel display substrates, etc. The high-flow is achieved in part by providing a large outlet port in an endwall such as in the bottom of the chamber and mounting the substrate support on a support arm which provides minimized impedance to gas flow and minimized asymmetry with respect to gas flow across the exposed surface of the substrate.

According to one aspect of the invention, the chamber includes an opening in the sidewall thereof and the substrate support extends through the opening so as to be removably mounted in the interior of the chamber. Such a mounting arrangement allows easy servicing of the substrate support since the substrate support can be entirely removed from the chamber through the opening in the sidewall. Prior to the invention, it was conventional to mount the substrate support on the bottom wall of the vacuum processing chamber and the chamber was evacuated by one or more vacuum pumps connected to outlet ports in the sidewall or in the area of the bottom of the chamber surrounding the substrate support. Such arrangements provide less than ideal evacuation of the chamber and make servicing of the substrate support difficult and time consuming.

Figure 1:
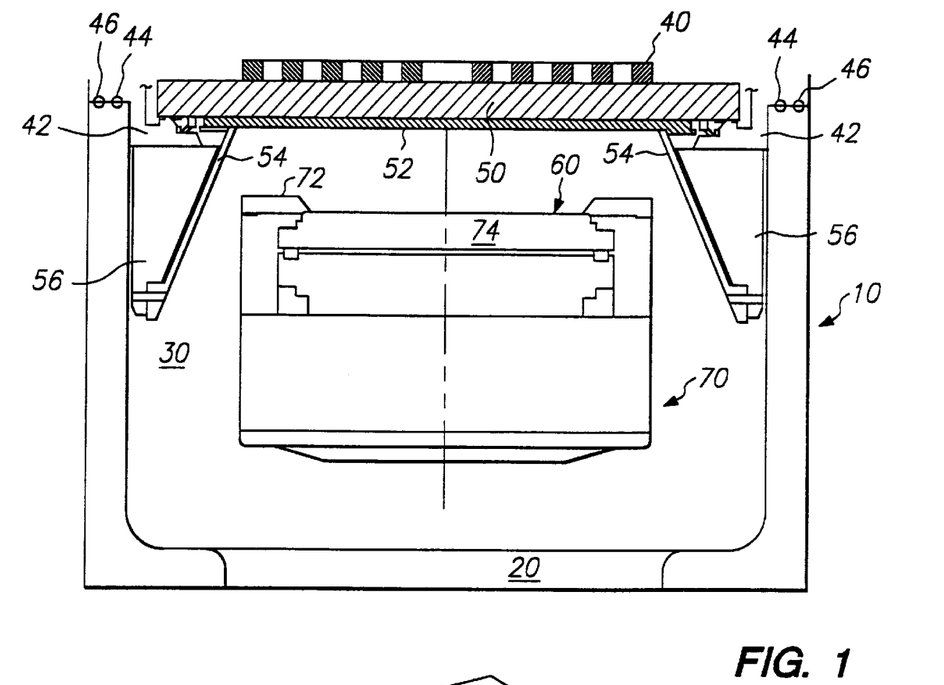
FIG. 1 is a schematic view of a vacuum processing chamber according to the present invention.

A vacuum processing chamber according to the present invention may be used for various semiconductor plasma processing steps such as etching, deposition, resist stripping, etc. An example of a vacuum processing chamber 10 having an inductively coupled plasma source is shown in FIG. 1 wherein processing gas is supplied to the processing chamber 10 by suitable apparatus such as gas distribution rings, gas distribution plate, injection nozzles, etc., and a vacuum is maintained in the interior 30 of the chamber by suitable vacuum pump apparatus supported by a modular mounting arrangement connected to a large outlet port 20 in an endwall such as the bottom of process chamber. The vacuum processing chamber can be supplied RF power through an external RF antenna such as a planar coil 40 outside a dielectric window 50 on an endwall such as the top of the chamber. However, the plasma generating source can be of any other type of plasma generating equipment such as that of an ECR reactor, parallel plate reactor, helicon reactor, helical resonator, etc. The plasma generating source is attached to a modular mounting arrangement such as an annular mounting flange 42 which is removably mounted on the endwall of the chamber. In order to maintain a vacuum tight seal between the mounting flange 42 and the chamber 10, an O-ring seal 44 fits within a groove in the endwall of the chamber 10 and an RF shielding member 46 surrounds the vacuum seal. Due to the large vacuum force provided by the vacuum pump, it is not necessary to utilize fasteners for attaching the mounting flange 42 to the chamber 10. Instead, the mounting flange 42 can simply rest on the endwall of the chamber 10. If desired, the mounting flange 42 or another part of the plasma generating source assembly can be hinged to the chamber 10 such that the plasma generating source can be pivoted to an orientation such as a vertical orientation for servicing the interior 30 of the chamber 10.

Figure 2:
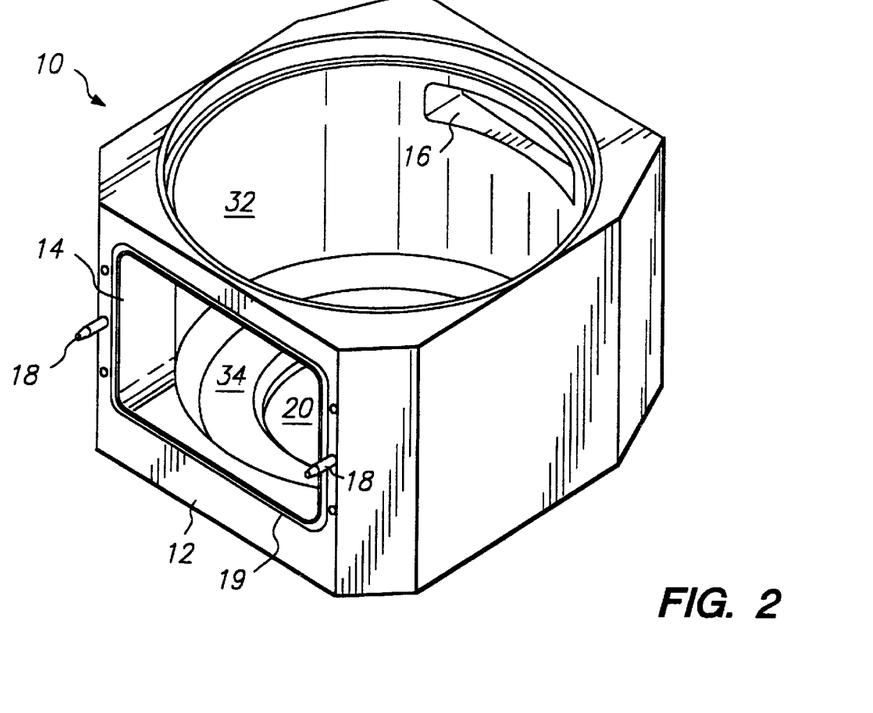
FIG. 2 is a schematic view of a vacuum processing chamber according to the invention without the substrate support and top wall mounted plasma generating device shown in FIG. 1.

A substrate 60 is supported within the chamber on a substrate support 70 which is removably supported by a modular mounting arrangement from a sidewall 12 of the chamber 10. The substrate support 70 is at one end of a support arm 80 mounted in a cantilever fashion such that the entire substrate support/support arm assembly 70/80 can be removed from the chamber by passing the assembly through an opening 14 in the sidewall of the chamber, as shown in FIG. 2. The substrate support can include a chucking apparatus such as a mechanical ring clamp 72 and an RF biasing electrode 74 located in a central portion of the chamber below dielectric window 50. Alternatively, the chucking apparatus can comprise any suitable arrangement such as an electrostatic monopolar chuck of an electrically conductive material such as aluminum containing water cooling channels and grounded to a portion of the chamber or a multipolar chuck having electrically conductive electrodes covered with a layer of insulating material such as alumina.

The chucking arrangement according to the invention can be used in a plasma or non-plasma environment. Thus, while a specific embodiment of the invention is described below with reference to a chuck used to hold a semiconductor substrate in a plasma environment, the substrate support assembly according to the invention can be used in other process chambers. Further, the chucking arrangement can incorporate (1) a mechanical clamp, (2) a monopolar ESC or a bipolar, multi-polar or flux-line ESC for holding semiconductor wafers or dielectric substrates in a plasma, non-plasma, vacuum or non-vacuum environment or (3) a monopolar ESC for holding dielectric substrates, such as glass panels used in making flat panel displays, in a plasma environment wherein the plasma is not used to supply ions to the substrate surface for purposes of clamping but rather, the plasma completes an electrical circuit between the monopolar ESC and a grounded surface such as part of the wall of the plasma processing chamber. Whether or not the ESC provides underside gas cooling of the substrate, the substrate may be temperature controlled by a water cooled portion of the substrate support. The substrate support can have a rectangular, square, circular or other shape suitable for clamping the particular substrate to be clamped.

Figure 3:
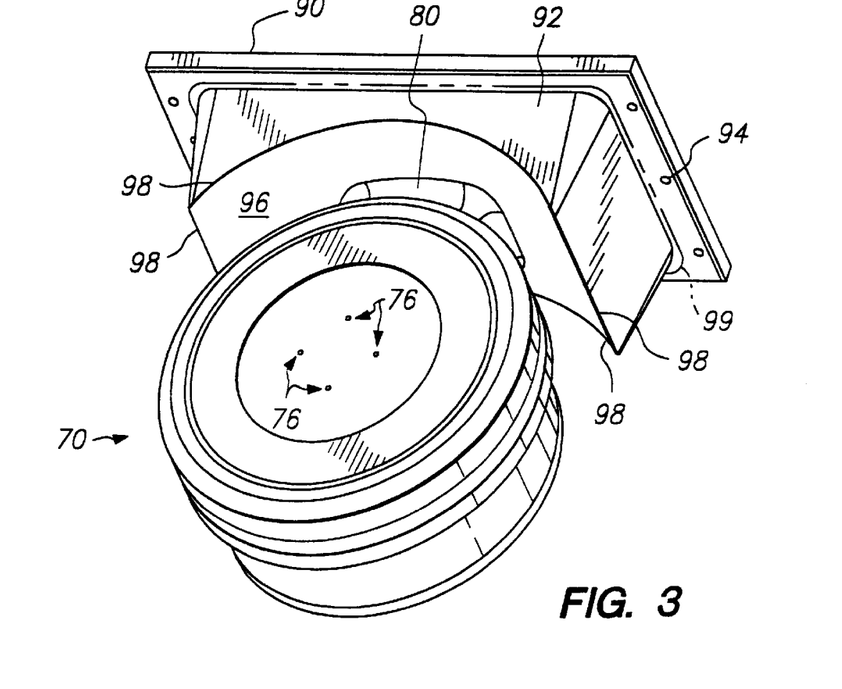
FIG. 3 is a schematic view of a substrate support according to the invention.

An example of a cantilevered chuck assembly in accordance with the invention is shown in FIG. 3. The assembly includes a substrate support 70, a support arm 80 and a mounting flange 90. The mounting flange includes a portion 92 which fits within opening 14 in sidewall 12 of the process chamber. In the embodiment shown, one end of the support arm 80 joins an outer surface of the substrate support 70 and an opposite end of the support arm joins the portion 92 of mounting flange 90. This arrangement can take various forms such as a one piece arrangement wherein the substrate support, the support arm and the flange are formed out of a single piece of material or a plurality of separate parts can be attached together to form the cantilever chuck assembly. The substrate support includes a removable cap having active components such as an ESC, RF biasing electrode or electrodes, lift pin holes, He backside cooling gas supply, etc.

As shown in FIG. 2, the chamber 10 includes a substrate transfer slot 16 through which a substrate such as a semiconductor wafer, flat panel, etc., can be transferred in a direction such as a horizontal direction by a suitable transfer mechanism into and out of the interior 30 of the chamber. The chamber 10 can include one or more guide pins 18 for positioning and/or guiding the portion 92 of the mounting flange 90 into the opening 14. As shown in FIG. 3, the mounting flange 90 can include guide pin bores 94 for receiving the guide pins 18. In the embodiment shown, the interior 30 of the chamber 10 includes a cylindrical sidewall surface 32 and an annular bottom surface 34 surrounding the outlet port 20. The portion 92 of the mounting flange 90 includes a curved surface 96 having edges 98 which lie along edges of the opening 14 in the cylindrical surface 32 when the mounting flange 90 is mounted onto the exterior of the chamber 10. Support arm 80 includes an outer periphery offset vertically from the support surface of the substrate support 70. The support arm 80 supports the substrate support 70 in the interior 30 of the chamber 10 such that the outer periphery of the substrate support is located inwardly of the cylindrical surface 32. Further, the portion 92 and the surfaces forming opening 14 are preferably tapered at an angle of no greater than 15°, e.g., 2–10°. Thus, when the portion 92 is fitted in the opening 14, the mating surfaces of the portion 92 and surfaces defining opening 14 provide a tapered fit. In order to maintain a vacuum tight seal between the mounting flange 90 and the chamber 10, an O-ring seal 99 (shown in dotted lines) can be provided around the portion 92 so as to fit within a groove 19 on an exterior of the chamber 10 surrounding the opening 14. Further, in order to minimize differences in ground potential between the chamber housing and the substrate support assembly, an RF shielding member surrounds the vacuum seal.

Figure 4:
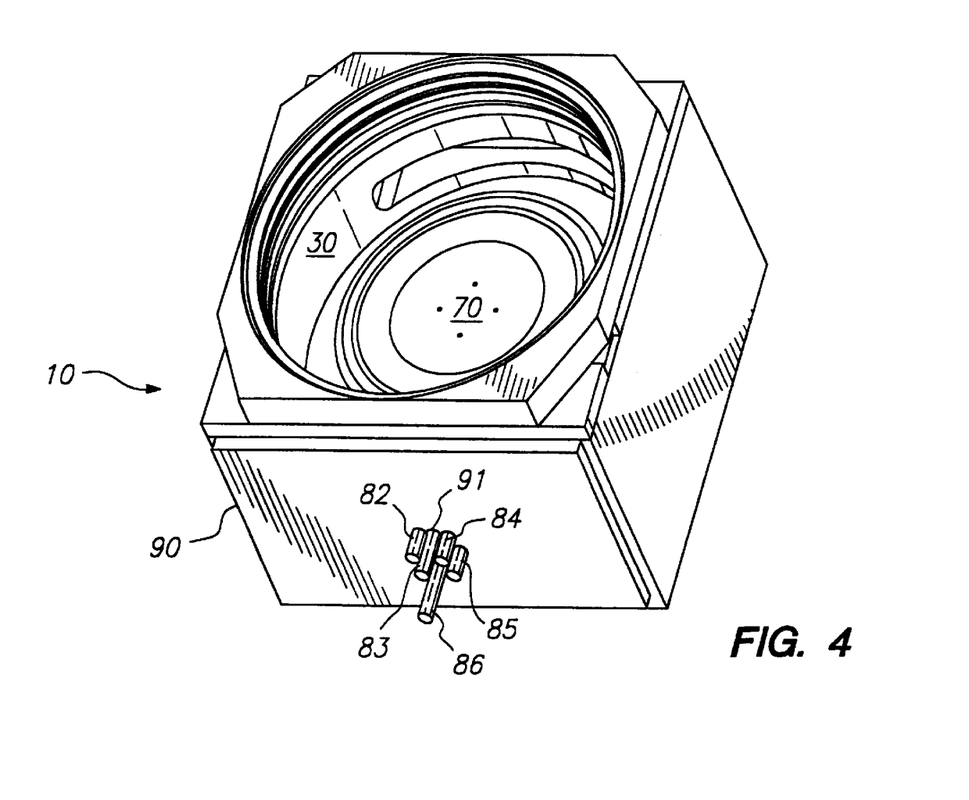
FIG. 4 is a schematic view of a vacuum processing chamber having the substrate support assembly according to the invention mounted therein but with the top mounted plasma generating device of FIG. 1 omitted therefrom.

FIG. 4 shows the substrate support mounted within the interior 30 of the chamber 10. The mounting flange 90 can be removably attached to an exterior of the chamber 10 by suitable fasteners such as bolts but such fasteners can be omitted since the vacuum provided by the vacuum pump adequately seals the mounting flange to the exterior of the chamber. A service conduit passage 91 is provided in the mounting flange 90 for passage of service conduits 82–86 therethrough. Service conduits 83 and 84 can be connected to an external chiller whereby temperature controlling liquid can be passed through the substrate support for maintaining the temperature thereof at a desired level during processing of a substrate. Service conduit 84 can be used for supplying a temperature control gas to the backside of the substrate. For instance, conduit 84 could be used to carry pressurized helium gas supplied beneath the substrate through lift pin holes 76. Service conduit 85 can supply pressurized gas to a pneumatic actuator of a lift pin mechanism (not shown) in the substrate support. Service conduit 86 can be used to provide RF power to the RF biasing electrode 74. Of course, other service conduits can also be provided for various functions such as monitoring temperature of the substrate support or pressure of the backside cooling gas, supplying nitrogen or clean dry air ("CDA") to keep moisture out of the service via, and/or supplying electrical power to components of the substrate support.

FIGS. 1–4 show an arrangement wherein a single support arm 80 extends between the mounting flange 90 and the substrate support 70. However, for large substrates, more than one support arm can be provided extending between the substrate support and the mounting flange 90. In such an embodiment, the above described service conduits may be distributed among the plural arms. Because the additional support arm or arms will be coupled to a single mounting flange, the substrate support still retains the convenience of being easily removed for serviceability, flexibility or retrofitting. Further, in order to provide RF current return circuit symmetry, one or more electrically conductive arms can be provided in the chamber in a manner such that the RF current generated in the substrate support 70 can be grounded to the sidewall 32 by one or more arms extending between the sidewall 32 and the substrate support 70. Such an additional arm or arms could extend inwardly from the sidewall 32 and engage the substrate support 70 when the substrate assembly is inserted through the opening in the sidewall. Alternatively, the substrate support 70 could include one or more arms extending therefrom for engagement with the sidewall 32 when the substrate support assembly is inserted in the opening 14. Since these arms merely provide a symmetrical ground path, and no service conduits, they likewise do not affect the "plug-in" nature of the substrate support.

The chamber 10 shown in FIG. 1 includes a plasma generating device in the form of a five turn planar coil which transmits RF energy through dielectric window 50. In order to supply process gas to the interior of a chamber, a gas distribution plate 52 is provided adjacent dielectric shield 50. Also, the arrangement shown in FIG. 1 includes a conical liner 54 extending from gas distribution plate 52 and surrounding the substrate support 70. The liner 54 is temperature controlled by one or more members 56 which can include resistance heaters, fluid passages, etc., for controlling the temperature of the liner 54 during processing of substrates. In order to prevent coupling of RF energy into the liner 54 or into member 56, the outer periphery of the antenna 40 is preferably inwardly of the inner surface of liner 54. The gas distribution plate 52 includes through holes for passing process gas supplied to a space between dielectric window 50 and gas distribution plate 52. However, plate 52 could be omitted and process gas could be supplied by other gas feeding arrangements. Further, the cantilever chucking arrangement according to the invention can be used with any vacuum processing chamber design.

According to one aspect of the invention, it is possible to assemble or replace the plasma generating source since the plasma generating source can be removably attached to the chamber by a modular mounting arrangement. For instance, the modular mounting arrangement can support various types of plasma generating sources such as an electrode of a parallel plate electrode arrangement, an inductively coupled plasma source, a helicon source, a helical resonator, an ECR source, an upstream plasma generating source, etc. According to a preferred embodiment, the plasma generating source comprises a planar coil such as a multiturn spiral coil exterior to a dielectric window with an optional gas distribution plate located below the dielectric window. The modular mounting arrangement thus allows the same chamber design to be customized for a particular processing regime such as etching oxide, polysilicon, metal, etc., deposition such as dielectric films, etc., photoresist stripping, etc. The modular mounting arrangement can comprise a mounting flange such as is shown in FIG. 1. However, the window 50 or a plate of the plasma generating source assembly could be mounted directly on the endwall of the chamber 10 in which case the mounting arrangement would include an O-ring, a groove receiving the O-ring and a sealing surface facing the groove with the O-ring therebetween.

In the case where an antenna is used as the plasma generating source, the modular mounting arrangement for the plasma generating source allows different antenna designs to be used for generating plasma in the chamber 10. Also, in order to achieve a desired spacing between the substrate to be processed and the antenna, the plasma generating source can be of a reentrant type wherein the window and antenna are slidable axially into the interior 30 of the chamber. The modular mounting arrangement for the plasma generating source also allows different gas feed arrangements. For instance, the process gas can be supplied through a gas distribution plate such as the plate 50 shown in FIG. 1. Alternatively, the process gas could be supplied by other arrangements such as one or more rings having a plurality of outlets therein for directing the process gas inwardly into the space between the substrate and the antenna 40.

According to another aspect of the invention, it is possible to assemble or replace the vacuum pumping mechanism for evacuating the chamber since the vacuum pumping mechanism can be removably attached to the chamber by a modular mounting arrangement. For instance, the modular mounting arrangement can support various types of vacuum pumping mechanisms such as a high capacity magnetically levitated turbomolecular pump having a pumping capacity of 1000 to 3000 liters/second. A preferred vacuum pump is a hybrid turbomolecular/drag pump having a turbomolecular pump in a front section and a molecular drag pump in a rear section thereof. Such hybrid pumps are available from OSAKA Vacuum and Seiko Seiki, both of Japan. Depending on the process carried out in the chamber, other types of pumps such as a mechanical pump, a cryogenic pump, diffusion pump, etc., could be mounted on the modular mounting arrangement.

Figure 5:
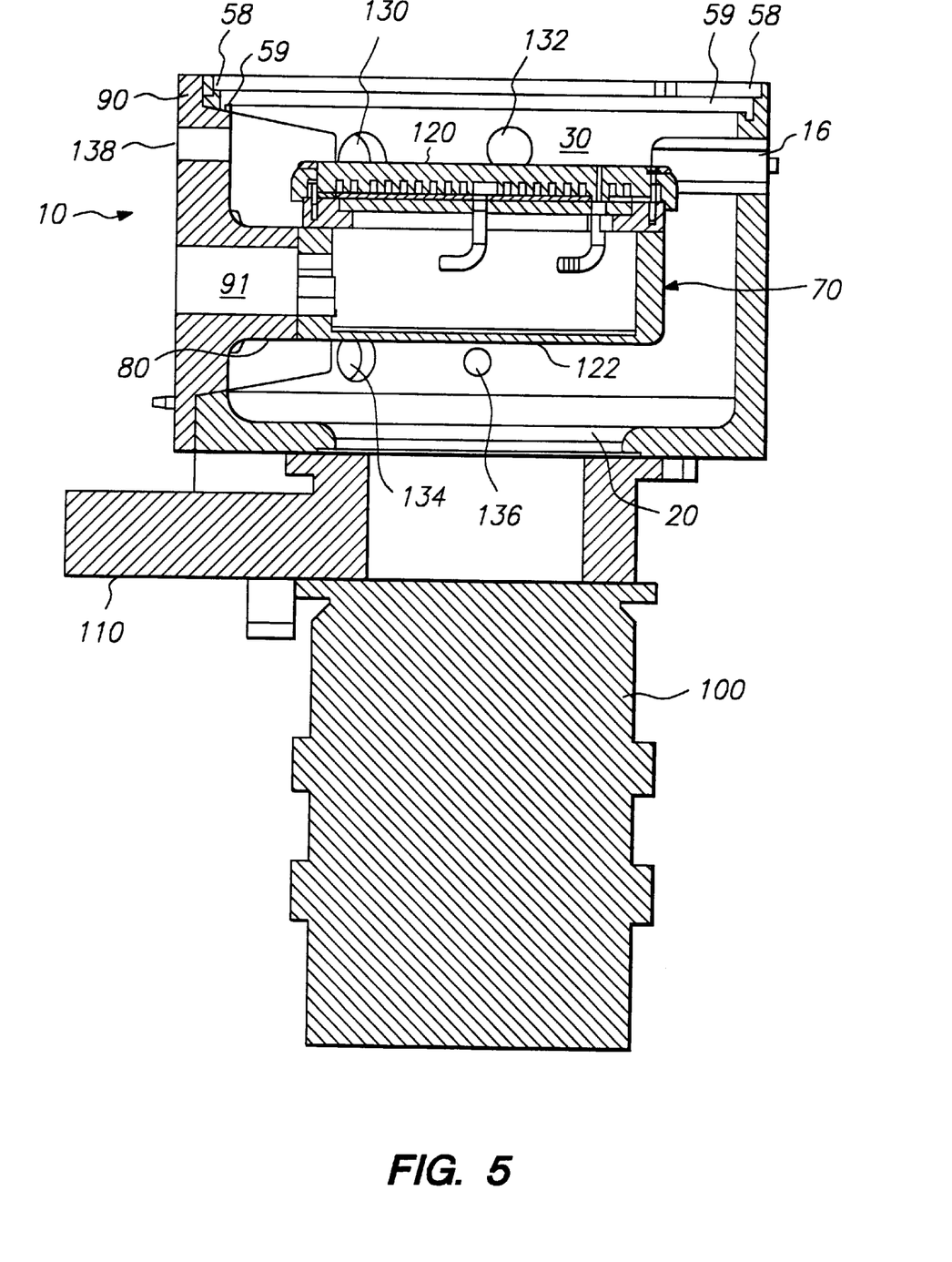
FIG. 5 shows a cross-section of a universal chamber housing of a vacuum processing chamber according to the invention, the housing including a cantilevered substrate support and a vacuum pump.
Figure 6:
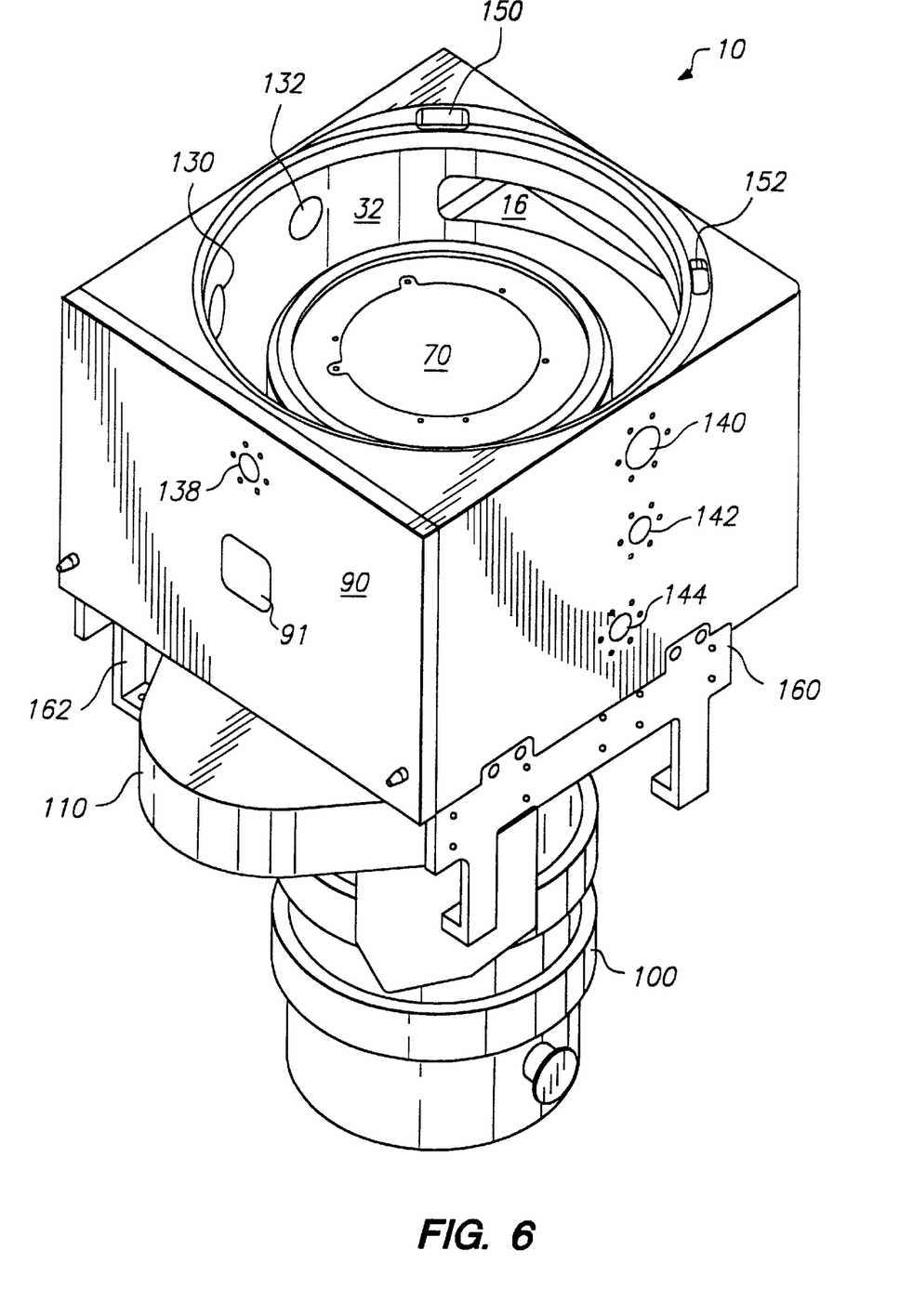
FIG. 6 shows a perspective view of the universal housing of FIG. 5.
Figure 7:
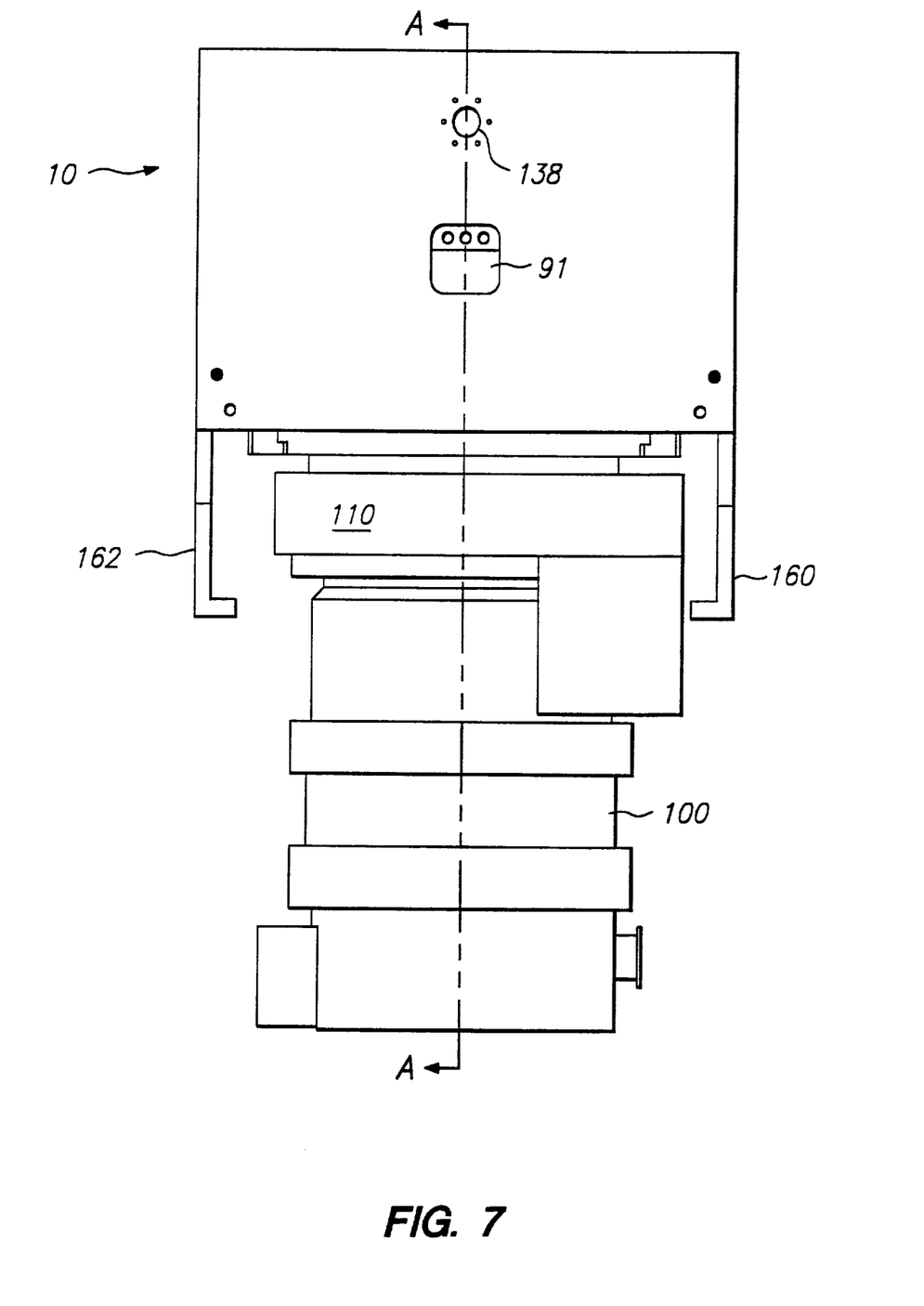
FIG. 7 shows a side view of the universal housing of FIG. 5.
Figure 8:
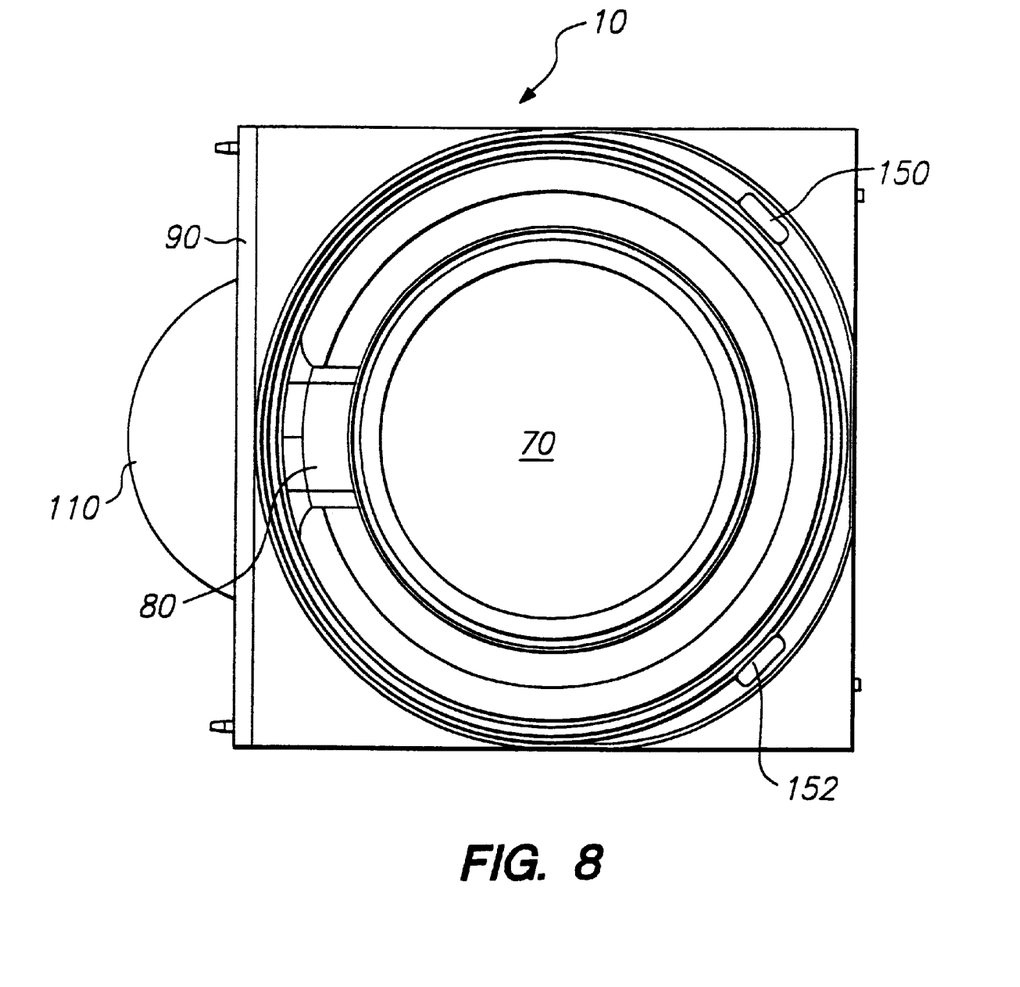
FIG. 8 shows a top view of the universal housing of FIG. 5.

FIGS. 5–8 show various features of a suitable modular mounting arrangement for a vacuum pump 100. The interior 30 of the chamber 10 is isolated from the vacuum pump by a suitable gate valve 110. The gate valve 110 is mounted on the chamber 10 by a suitable modular mounting arrangement and the vacuum pump 100 is mounted on the gate valve 110 by another suitable modular mounting arrangement. As shown in FIG. 5, the upper endwall of the chamber 10 includes two recessed surfaces which provides a vacuum sealing interface for engagement with the plasma generating source assembly. For instance, the outer recessed surface 58 includes a groove and an O-ring which engages a sealing surface of the window 50 and the inner recessed surface 59 includes a groove and an O-ring for engaging a sealing surface on the gas distribution plate 52.

As shown in FIG. 5, the substrate support 70 includes a water cooled electrostatic chuck 120 removably mounted on a support housing 122. The service passage 91 containing service conduits 82,83 (not shown) opens into an open space defined within the support housing 122. The mounting flange 90 and support arm 80 form an integral piece which is sealingly engaged with the support housing 122 in a suitable manner such as by a permanent bond (e.g., weld, braze, etc.) or by mechanical fasteners in which case an O-ring surrounding an RF shielding member are interposed in parallel grooves between opposed surfaces of the support arm 80 and the support housing 122.

In order to monitor process parameters, one or more auxiliary ports 130,132,134,136,138,140,142,144 can be provided for use of equipment such as a Langmuir probe, a bypass valve, a manometer, plasma diagnostics, laser measurement equipment, etc. Such auxiliary ports are useful for chambers used for research and development but some or all of the ports can be omitted in a chamber used in a production environment.

In order to supply the gas distribution plate 52 with gas to be introduced into the space between the substrate 60 and the gas distribution plate 52, the endwall of the chamber 10 can include one or more gas supply ports 150,152 which are adapted for connection to suitable gas supplies. The ports 150,152 allow gas to be supplied to a gap between the window 50 and the gas distribution plate 52.

The chamber 10 can include support brackets 160,162 for supporting the chamber on a support frame (not shown). If desired, such a frame can include a first section supporting the chamber 10 and separate nesting section supporting the vacuum pump 100. Such an arrangement allows the vacuum pump 100 to be retracted away from the chamber 10, thus allowing servicing of the vacuum pump or replacement of the pump with another pump on another nesting frame section.

The gate valve 110 and vacuum pump 100 are attached to the chamber 10 in the same manner as the plasma generating source assembly and the substrate support assembly using a common vacuum sealing interface comprising at least one O-ring, a groove receiving the O-ring and a sealing surface pressing the O-ring into the groove. For instance, the gate valve 110 can include a pattern of bolts (e.g., a row of 5 bolts) on each side of the chamber for attaching the gate valve 110 to the chamber 10 with at least one O-ring and RF shielding member therebetween. For alignment purposes, the vacuum pump 100 can be attached directly to the chamber 10 or to the gate valve 110 using a centering ring wherein a flange of the centering ring fits into mating recesses in opposed surfaces of the vacuum pump and the gate valve or chamber. If the process to be used in the chamber does not require low pressure, the vacuum port 20 can be sealed with a suitable sealing arrangement and the chamber can be maintained at a desired pressure by a mechanical pump attached to an auxiliary port such as port 144 in the sidewall of the chamber.

Various substrate supports can be mounted in the chamber 10 depending on the type of substrate (e.g., flat panel display substrate, semiconductor wafer, etc.), the size of the substrate (e.g., 300×600 mm glass substrate, 4, 6, 8 or 12 inch wafer, etc.) and the process to be carried out in the chamber. Depending on the process, it may be desirable to use a mechanical clamp, an ESC or omit clamping. Also, the process may require different degrees of cooling or heating of the substrate. Further, in multistep processes wherein the position of the substrate is changed, the substrate support or plasma generating source may include a telescoping mechanism to adjust the position of the substrate support relative to a plasma generating source (e.g., 11 cm gap for metal etching, 8 cm gap for oxide etching, etc.). Also, the substrate support may include a pin lift arrangement such as a pneumatic or cable driven pin lift mechanism wherein lift pins are mounted on a lifter plate or are individually driven by cable assemblies. For larger substrates (e.g., 300 mm wafers and glass panels the pin lift mechanism can utilize a three lift pin arrangement wherein the lift pins are located on a circle and spaced 120° apart, the lift pins being independent of each other and individually driven by a cable assembly as disclosed in commonly owned U.S. Pat. No. 5,796,066, the disclosure of which is hereby incorporated by reference.

For some processes, it may be desirable to connect a mechanical pump to an auxiliary port in the sidewall of the chamber. For instance, a vacuum line (such as a ¾ or ⅕ inch line) could be connected to auxiliary port 144 for pumping down the chamber 10 prior to activating the vacuum pump 100. Also, it may be desirable to substitute a mechanical pump in place of the vacuum pump 100 in which case suitable vacuum line connections can be used for connecting the inlet (e.g., 4 inch inlet) of the mechanical pump to the gate valve 110 or directly to the larger vacuum port 20.

Figure 9:
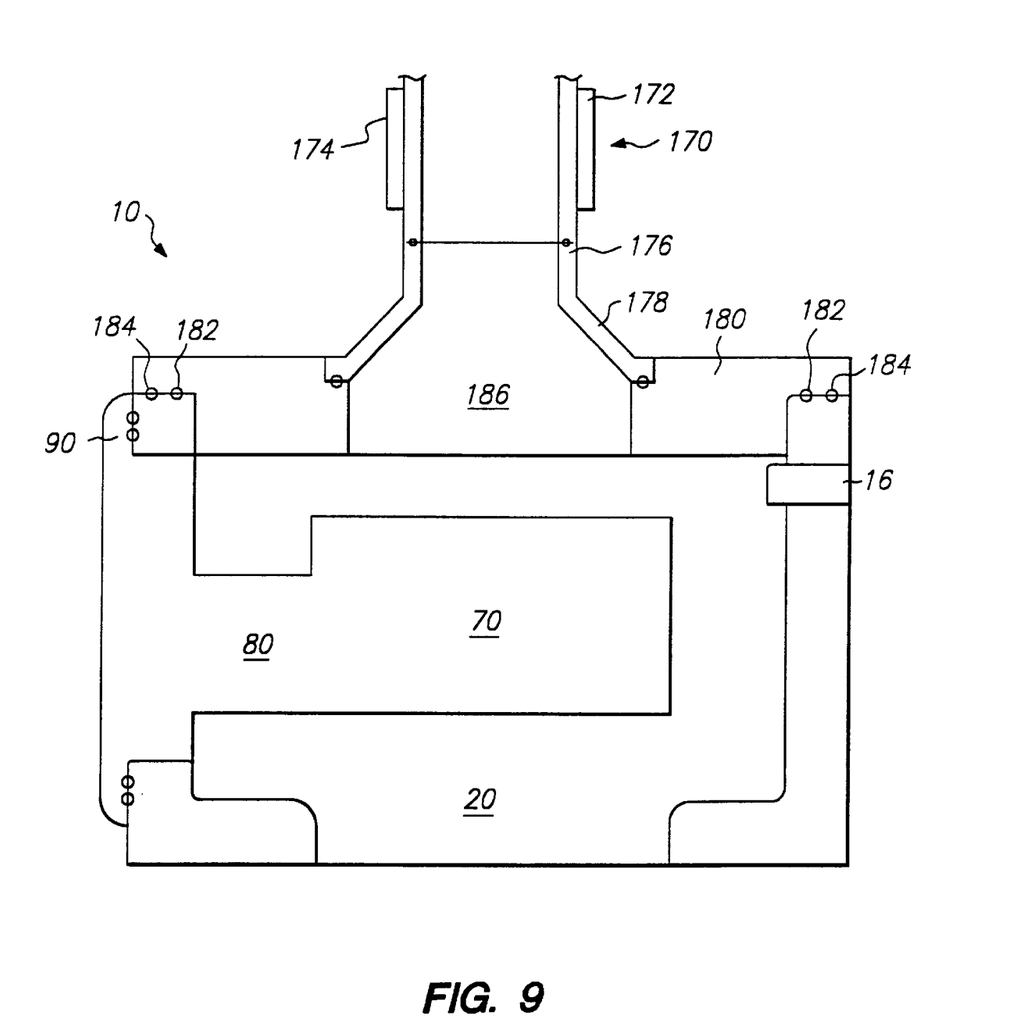
FIG. 9 shows a cross-section of a universal housing according to a further embodiment of the invention wherein the housing includes a cantilevered substrate support and an upstream plasma generating source.

FIG. 9 shows a modular plasma generating source 170 which can be used for isotropic etching an oxide layer. The plasma generating source 170 includes a pair of opposed curved rectangular electrodes 172,174 fitted against the exterior of a dielectric cylinder 176. Process gas is introduced into the cylinder 176 and energized into a plasma state by RF energy supplied to the electrodes 172,174. The cylinder can be removably attached to a funnel 178 supported on plate 180. Thus, plasma created upstream of chamber 10 can be supplied through flow passage 186. The plate 180 is removably attached in a vacuum sealing manner to the upper endwall of the chamber 10. For example, O-ring 182 and surrounding RF shielding member 184 are located between opposed surfaces of the plate 180 and the chamber 10. Likewise, to seal the other components, O-ring and RF gaskets are located between one end of the funnel 178 and plate 180 and between the other end of the funnel 178 and the cylinder 176. Due to the intense plasma created between electrodes 172,174 the inner surface of the cylinder 176 becomes eroded by the plasma and the removably mounted cylinder 176 can be periodically replaced.

The chamber is preferably isolated from the vacuum pumping arrangement by a gate valve. The gate valve can be attached to the modular mounting arrangement for the vacuum pump or it can be attached directly to the chamber. In a preferred embodiment, the gate valve comprises a plate which moves from an open position away from the chamber to a closed position wherein the plate sealingly engages the chamber. A suitable gate valve of this type is available from VAT, a Swiss company.

According to a further aspect of the invention, it is possible to assemble or replace a liner in the chamber. For instance, with the chamber open it is possible to slide a liner of process compatible material through an access port into the chamber and hold the liner in place with suitable fasteners or simply by attaching a cover to the access port. The liner can include suitable openings which align with various openings in the chamber. According to a preferred embodiment, the liner is supported on pegs in the chamber and held in place by the modular mounting arrangement for the plasma generating source. The liner material can comprise any vacuum and/or process compatible material such as a metal (e.g., aluminum), a dielectric material (e.g., quartz, alumina, aluminum nitride, etc.), a coated material (e.g., anodized aluminum), etc. In the case of a metal liner, it may float electrically or it may be grounded. Further, the liner can include a temperature control mechanism such as one or more passages for flow of a temperature control fluid, one or more heaters such as one or more resistance heating elements, etc.

The chamber design permits high flow of process gas while maintaining a desired pressure in the chamber. Such high flow is achieved due to the chamber wall mounted cantilever chuck design which allows substantially symmetrical gas flow through the chamber and frees up space on a wall of the chamber opposite to a wall on which the plasma generating source is located. As such, a large vacuum port can be provided having a cross-sectional area greater than the cross-sectional area of the substrate support.

According to a preferred embodiment of the invention, the substrate support is held at or near the center of a circular vacuum chamber by one or more support arms extending from a sidewall of the chamber. The support arm preferably is attached to a sidewall of the substrate support and has a smaller cross-section than the support surface of the substrate support in order to minimize non-uniform gas flow through the chamber, i.e., disruption to uniform flow of gases to a vacuum port located in an endwall of the chamber. To achieve optimum flow, the flow area between the substrate holder and the inner surface of the sidewall of the chamber is preferably at least approximately 0.3 times, more preferably approximately at least 0.5 times, and most preferably approximately equal to or greater than the cross-sectional area of the substrate holder and/or vacuum port. For instance, according to one embodiment of the invention, the flow area can be 1 to 2 times the cross-sectional area of the substrate support. Also, the surface of the outer periphery of the support arm closest to the plane of the exposed substrate surface is spaced downstream, e.g., at least ½ inch, preferably at least ½ the thickness of the support arm.

In the case of a substrate support for an 8 inch semiconductor wafer, the vacuum port can comprise a large opening such as a 10 inch to 1 foot in diameter opening sealed by a suitably sized gate valve. The support arm is shaped and sized to minimize pumping asymmetry. For instance, a circular support arm can have a diameter of 2 to 3 inches or a non-circular support arm such as an oblong or rectangular support arm can have a cross-section which varies from 2 to 5 inches in width.

The annular gap between the inner surface of the sidewall of the chamber and the outer periphery of the substrate support preferably has a cross-sectional area exceeding that of the wafer and/or vacuum port. For example, in the case of an 8 inch wafer, the substrate support can have a total diameter of 12 inches and the chamber can have a diameter of 18 inches. In such a case, the 3 inch wide flow area between the chamber sidewall and the substrate support provides an annular flow passage having a cross-sectional flow area of about 140 square inches compared to the substrate holder which has a cross-sectional area of about 110 square inches.

In the case of a 12 inch wafer, if the substrate support has a diameter of 14 inches and the chamber has a diameter of 18 inches, the annular flow area will be smaller in cross-sectional area (about 100 square inches) than the substrate holder (about 150 square inches). While such a chamber design may provide desirable gas flow for certain applications, improved high flow at low pressure can be achieved by decreasing the size of the substrate support and/or increasing the size of the chamber, e.g., making the substrate support smaller such as smaller than about 12.5 inches in diameter and/or making the chamber larger such as larger than about 20 inches in diameter.

The flow area between the substrate support and the vacuum port is preferably larger in area than the annular flow area between the substrate support and the inner sidewall surface of the chamber. For instance, if the chamber sidewall and substrate holder are separated by a 3 inch wide annular gap, the distance between the endwall of the substrate holder and vacuum port preferably exceeds 3 inches, e.g., 4 or more inches. To increase the flow area between the substrate support and vacuum port, the outer periphery of the endwall of the substrate support facing the vacuum port can be rounded or tapered and/or the opening in the endwall of the chamber in which the vacuum port is located can be rounded or tapered.

With the foregoing relationships, less than 10%, preferably less than 5%, and more preferably less than 1%, variation in pressure across the entire exposed surface of a substrate such as an 8 inch or 12 inch wafer can be achieved while maintaining the chamber at a pressure of less than 100 mTorr, e.g., 1 to 50 mTorr. The pumping speed seen at the substrate surface is typically about half (e.g., 1000 l/sec.) of the pumping speed (e.g., 2000 l/sec.) of the vacuum pump. Further, the pressure seen at the substrate surface will depend on the amount of process gas flowing into the chamber and the ability of the vacuum pump to withdraw the dissociated gas from the chamber. For example, if the vacuum pump has a pumping speed of 1000 l/sec., with 80 sccm process gas flow, when the gas is dissociated into a plasma state the volume of the gas essentially doubles and the vacuum pump may only provide a vacuum of about 2 mTorr in the chamber. As some processes utilize 200 to 300 sccm process gas, once dissociated and doubled in gas volume, the vacuum pump may only provide a vacuum of about 6 mTorr.

Figure 10:
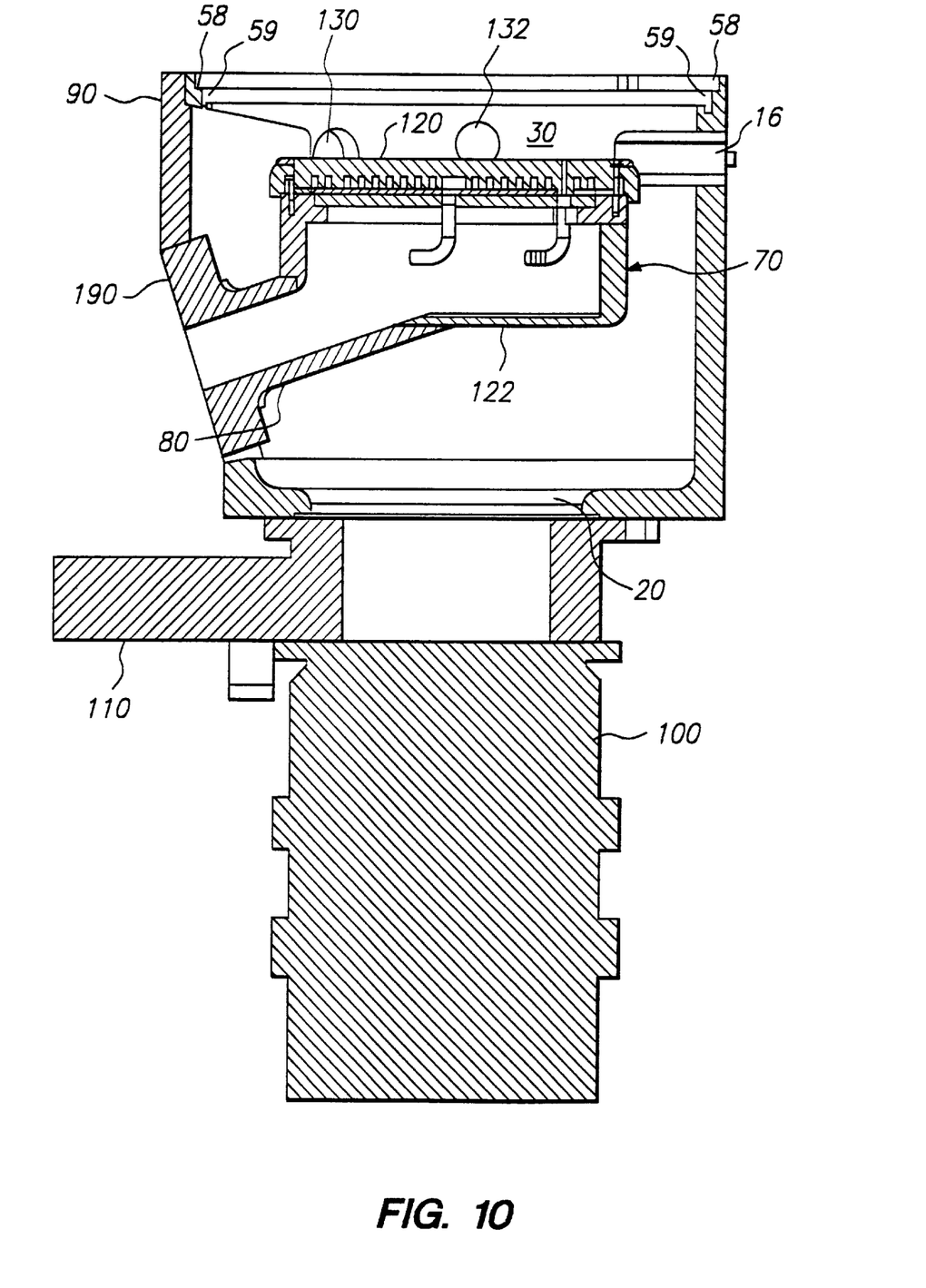
FIG. 10 shows a cross-section of a further vacuum processing chamber in accordance with the invention.

As shown in FIG. 10, the footprint of the vacuum processing apparatus 10 can be reduced by providing an angled sidewall from which the substrate support 70 is supported. For instance, instead of extending in a direction perpendicular to the sidewall, the support arm 80 can extend at an angle between the substrate support 70 and a non-vertically oriented sidewall 190. Such an arrangement takes up less floor space due to the reduced size of the lower end of the chamber and allows access to the entire periphery of the chamber surrounding the substrate support.

While the invention has been described in detail with reference to preferred embodiments thereof, it will be apparent to one skilled in the art that various changes can be made, and equivalents employed without departing from the spirit and scope of the invention.

What is claimed is:

1. A vacuum chamber apparatus having a substrate support removably mounted therein in a cantilever fashion comprising:

a substrate support mounted in an interior of a vacuum processing chamber, the chamber being a plasma processing chamber wherein plasma is provided in a region adjacent the substrate support;

an opening in a sidewall of the chamber, the opening being large enough to allow the substrate support to be removed from the chamber through the opening; and a mounting arrangement extending through the opening and removably supporting the substrate support in the interior of the chamber at a position located inwardly of an inner sidewall surface of the chamber.

2. A vacuum chamber apparatus having a substrate support removably mounted therein in a cantilever fashion comprising:

a substrate support mounted in an interior of a vacuum processing chamber;

an opening in a sidewall of the chamber, the opening being large enough to allow the substrate support to be removed from the chamber through the opening;

a mounting arrangement extending through the opening and removably supporting the substrate support in the interior of the chamber at a position located inwardly of an inner sidewall surface of the chamber; and the chamber being a high density plasma processing chamber wherein high density plasma is provided in a region adjacent the support substrate, the substrate support including a chucking device which clamps a semiconductor substrate on a support surface of the substrate support.

3. The vacuum chamber apparatus of claim 1, wherein the chamber includes a vacuum port in a central portion of an endwall of the chamber, the endwall being separated from the substrate support by an open area, the vacuum port being connected to a vacuum pump which removes gases from the interior of the chamber and maintains the chamber at a pressure below 100 mTorr.

4. The vacuum chamber apparatus of claim 1, wherein the mounting arrangement includes a mounting flange and a support arm, the mounting flange being attached to an exterior surface of the chamber, the support arm having one end thereof joined to the mounting flange and an opposite end thereof joined to the substrate support.

5. The vacuum chamber apparatus of claim 4, wherein the mounting flange includes a portion fitted in the opening in the sidewall of the chamber.

6. The vacuum chamber apparatus of claim 5, wherein the opening is tapered such that the opening decreases in size in a direction towards an interior of the chamber, the portion being tapered such that mating surfaces of the opening and the portion provide a tapered fit.

7. A vacuum chamber apparatus having a substrate support removably mounted therein in a cantilever fashion comprising:

a substrate support mounted in an interior of a vacuum processing chamber;

an opening in a sidewall of the chamber, the opening being large enough to allow the substrate support to be removed from the chamber through the opening;

a mounting arrangement extending through the opening and removably supporting the substrate support in the interior of the chamber at a position located inwardly of an inner sidewall surface of the chamber, the mounting arrangement including a mounting flange and a support arm, the mounting flange being attached to an exterior surface of the chamber, the support arm having one end thereof joined to the mounting flange and an opposite end thereof joined to the substrate support, the mounting flange including a portion fitted in the opening in the sidewall of the chamber; and the chamber including an interior cylindrical surface surrounding the substrate support, the opening in the sidewall of the chamber extending through the cylindrical surface, the portion including a curved surface facing the interior of the chamber, the curved surface having edges which lie along edges of the opening in the cylindrical surface.

8. A vacuum chamber apparatus having a substrate support removably mounted therein in a cantilever fashion comprising:

a substrate support mounted in an interior of a vacuum processing chamber;

an opening in a sidewall of the chamber, the opening being large enough to allow the substrate support to be removed from the chamber through the opening; and a mounting arrangement extending through the opening and removably supporting the substrate support in the interior of the chamber at a position located inwardly of an inner sidewall surface of the chamber, the mounting arrangement including a mounting flange and a support arm, the mounting flange being attached to an exterior surface of the chamber, the support arm having one end thereof joined to the mounting flange and an opposite end thereof joined to the substrate support, the support arm being sized such that flow of process gas through an annular gap between an outer periphery of the substrate support and the inner surface of the sidewall of the chamber is substantially uniform.

9. The apparatus of claim 1, wherein the mounting arrangement includes a vacuum seal sealing the opening and maintaining a vacuum tight seal between the chamber and the mounting arrangement.

10. The vacuum chamber apparatus of claim 1, wherein the chamber includes a modular plasma source, a modular vacuum pumping arrangement and a modular substrate support including the substrate support and mounting arrangement, the modular plasma source being interchangeable with another modular plasma source, the modular vacuum pumping arrangement being interchangeable with another modular vacuum pumping arrangement and the modular substrate support being interchangeable with another modular substrate support.

11. The vacuum chamber apparatus of claim 1, wherein the chamber includes an outlet port for evacuating the chamber, the outlet port being in an endwall of the chamber separated from the substrate support by an open space, the substrate support being separated from the sidewall of the chamber by an annular gap.

12. The vacuum chamber apparatus of claim 1, wherein the chamber includes a modular liner removably supported within the chamber, the liner including an opening aligned with the opening in the sidewall of the chamber, the opening in the liner being large enough to allow the substrate support to pass therethrough.

13. A substrate support which can be removably mounted in a vacuum processing chamber having an opening in a sidewall thereof large enough to allow the substrate support to be removed from the chamber through the opening, the substrate support comprising:

a substrate support which supports a substrate on a support surface of the substrate support; and a mounting arrangement attached to the substrate support, the mounting arrangement including a mounting flange and a support arm, the mounting flange being attachable to an exterior surface of the chamber, the support arm having one end thereof joined to the mounting flange and an opposite end thereof joined to the substrate support, the support arm being adapted to support the substrate support in the interior of the chamber at a position located inwardly of an inner sidewall of the chamber, the substrate support and support arm being small enough to pass through the opening for removal of the substrate support from the chamber, the support arm including a plurality of service conduits extending therethrough, the service conduits supplying at least one of a gas coolant, liquid coolant, RF energy, pressurized air, electrical monitoring signals or electrical actuating signals to or from the substrate support.

14. The substrate support of claim 13, wherein the substrate support includes an electrostatic clamp.

15. The substrate support of claim 13, wherein the mounting flange includes a portion adapted to fit in the opening in the sidewall of the chamber, the portion being tapered such that mating surfaces of the opening and the portion provide a tapered fit.

16. The substrate support of claim 13, wherein an outer periphery of the support arm is offset from a substrate support surface of the substrate support.

17. The substrate support of claim 13, wherein the mounting arrangement includes a vacuum seal adapted to seal the opening in the chamber and maintain a vacuum tight seal between the chamber and the mounting arrangement.

18. The substrate support of claim 12, wherein the substrate support includes a planar substrate support surface having a cross-sectional area of less than a flow area between an outer periphery of the substrate support and an inner surface of a vacuum processing chamber in which the substrate support is mounted.

19. A method of processing a substrate in a vacuum process chamber having an substrate support for supporting the substrate during processing thereof, the process chamber including an opening in a sidewall thereof, the opening being large enough to allow the substrate support to be removed from the chamber through the opening and a mounting arrangement extending through the opening and removably supporting the substrate support in the interior of the chamber at a position located inwardly of an inner sidewall of the chamber, the method comprising:

supplying a substrate to the process chamber at a position on a support surface of the substrate support;

clamping the substrate to the support surface of the substrate support; and processing the substrate with gas energized into a plasma state.

20. The method of claim 19, further comprising supplying a heat transfer gas between the substrate and the support surface of the substrate support.

21. The method of claim 19, wherein an exposed surface of the substrate is plasma etched during the processing step.

22. The method of claim 19, wherein the substrate is a glass panel suitable for use in making a flat panel display.

23. The method of claim 19, wherein the substrate support includes an electrostatic chuck and the substrate is a semiconductor wafer.

24. The method of claim 19, wherein an exposed surface of the substrate is subjected to a flow rate of over 1000 l/sec, with less than 5% variation in flow rate across the exposed surface.

25. The method of claim 19, wherein the process chamber is evacuated and gas flows through an annular flow area between an outer periphery of the substrate support and an inner surface of the sidewall of the chamber and then through an open flow area between the substrate support and a vacuum port, the annular flow area being larger than a cross-sectional area of the substrate support and the open flow area being larger than the annular flow area.

26. A vacuum chamber apparatus having a substrate support therein comprising:

a substrate support mounted in an interior of a vacuum processing chamber;

a mounting arrangement supporting the substrate support in the interior of the chamber at a position located inwardly of an inner sidewall surface of the chamber;

an outlet port for evacuating the chamber, the outlet port being in an endwall of the chamber separated from the substrate support by an open space, the substrate support being separated from the sidewall of the chamber by an annular gap, the annular gap having a cross-sectional flow area of at least approximately 0.3 times a cross-sectional area of the substrate support and the open space having a cross-sectional flow area larger than the flow area of the annular gap.

27. The vacuum chamber apparatus of claim 26, wherein the annular gap has a cross-sectional flow area of at least approximately 0.5 a cross-sectional area of the substrate support.

28. The vacuum chamber apparatus of claim 26, wherein the annular gap has a cross-sectional flow area of at least approximately 1 times a cross-sectional area of the substrate support.

* * * * *